United States Patent [19]
Smith et al.

[11] Patent Number: 5,217,216
[45] Date of Patent: Jun. 8, 1993

[54] HTCC/LTCC SUBSTRATE BLANKER/MULTI-LAYER COLLATION DIE

[75] Inventors: Hal D. Smith, Rancho Palos Verdes; George P. Pelzman, El Segundo; Joseph M. Jacobs, Redondo Beach, all of Calif.

[73] Assignee: Hughes Aircraft Company, Los Angeles, Calif.

[21] Appl. No.: 809,989

[22] Filed: Dec. 18, 1991

[51] Int. Cl.⁵ .................. B65H 39/02; B26D 7/06
[52] U.S. Cl. ........................... 270/58; 414/791; 414/794.7; 83/87
[58] Field of Search ............ 270/45, 51, 52, 52.5, 270/58, 59; 414/789.6, 791, 794.7; 83/87, 88, 109, 167, 691

[56] References Cited

U.S. PATENT DOCUMENTS

| | | | |
|---|---|---|---|
| 121,117 | 11/1871 | Mauger | 83/87 |
| 710,441 | 10/1902 | Diescher | 83/87 |
| 2,831,586 | 4/1958 | Patrick | 414/791 |
| 3,220,158 | 11/1965 | Roser et al. | 270/58 X |
| 3,547,280 | 12/1970 | Giegerich | 414/794.7 X |
| 3,670,612 | 6/1972 | Johnson et al. | 83/167 X |

FOREIGN PATENT DOCUMENTS 1299278 7/1989 Fed. Rep. of Germany ........ 270/58

Primary Examiner—Edward K. Look
Assistant Examiner—John Ryznic
Attorney, Agent, or Firm—L. A. Alkov; W. K. Denson-Low

[57] ABSTRACT

Apparatus for blanking and collating a plurality of individual pyrolyzable sheets having electrical circuit patterns formed thereon from an integral pyrolyzable sheet having the electrical circuit patterns for the individual sheets printed thereon, where the individual pyrolyzable sheets comprise layers of a hybrid module. The apparatus includes a die having substantially identically sized openings for supporting the integral printed pyrolyzable sheet, a punch assembly engageable with the die for blanking the integral printed pyrolyzable sheet into a plurality of substantially identically sized sheets having electrical circuit patterns formed thereon, and a collation structure located beneath the means for receiving the blanked sheets from the die and for stacking the blanked sheets.

1 Claim, 4 Drawing Sheets

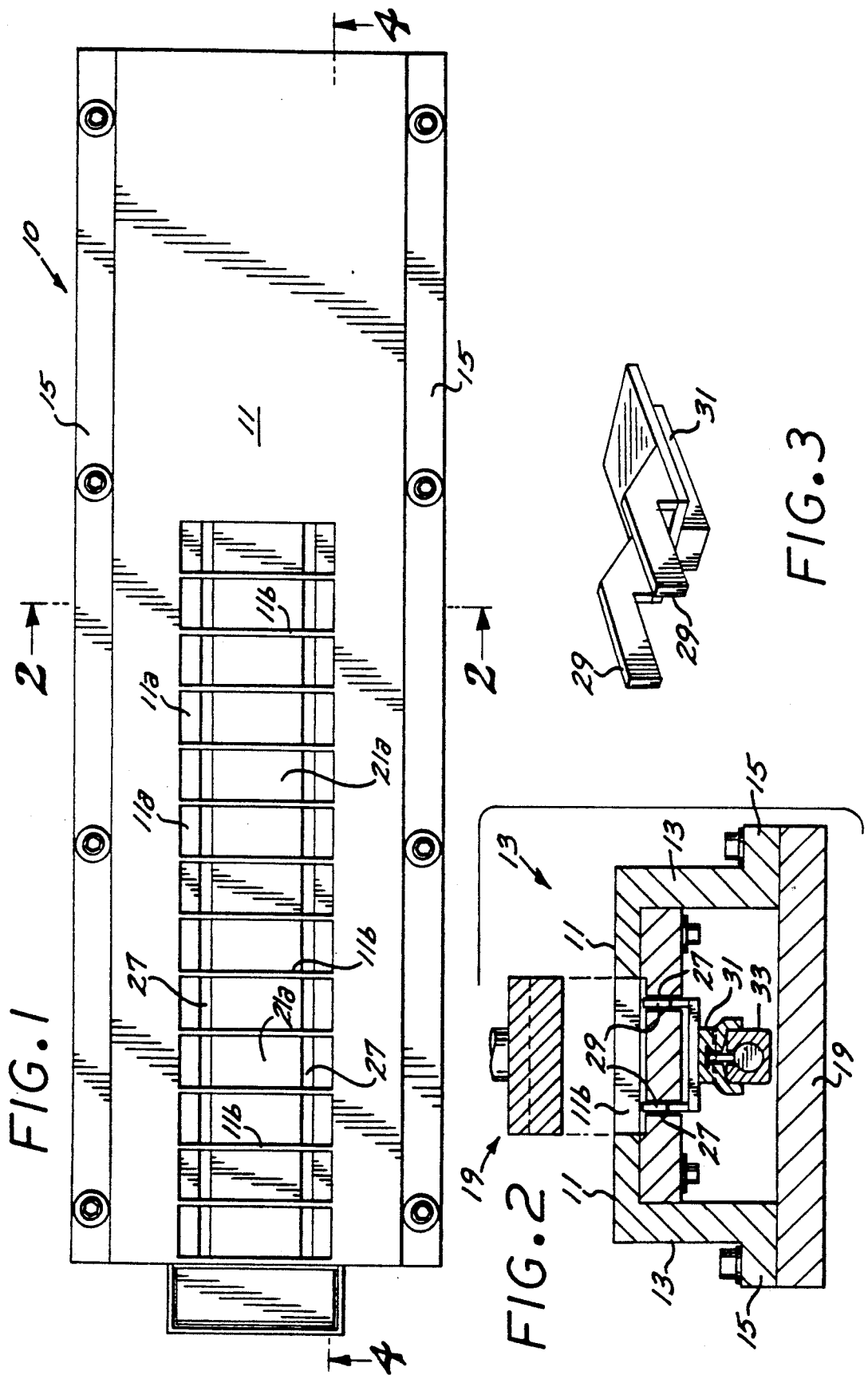

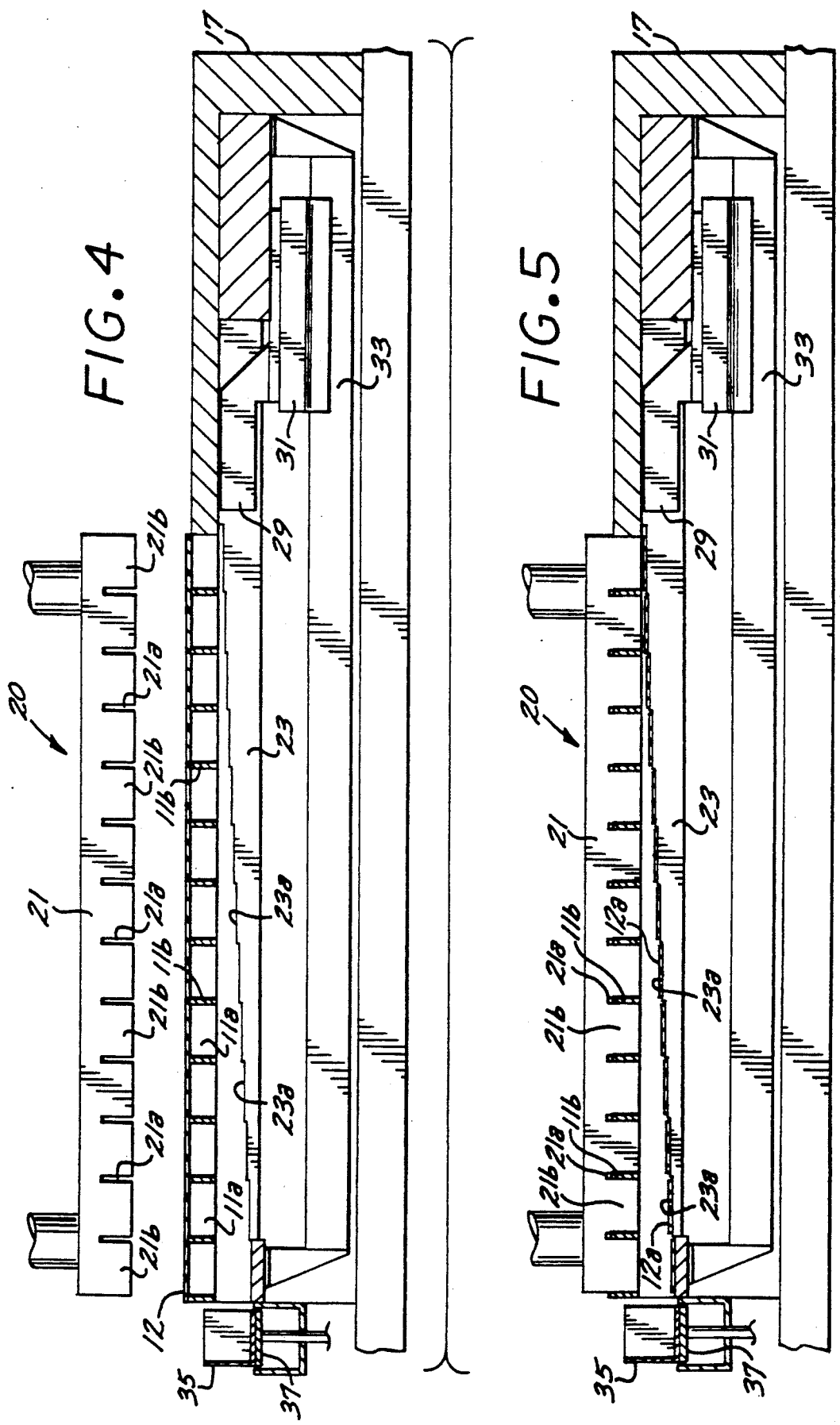

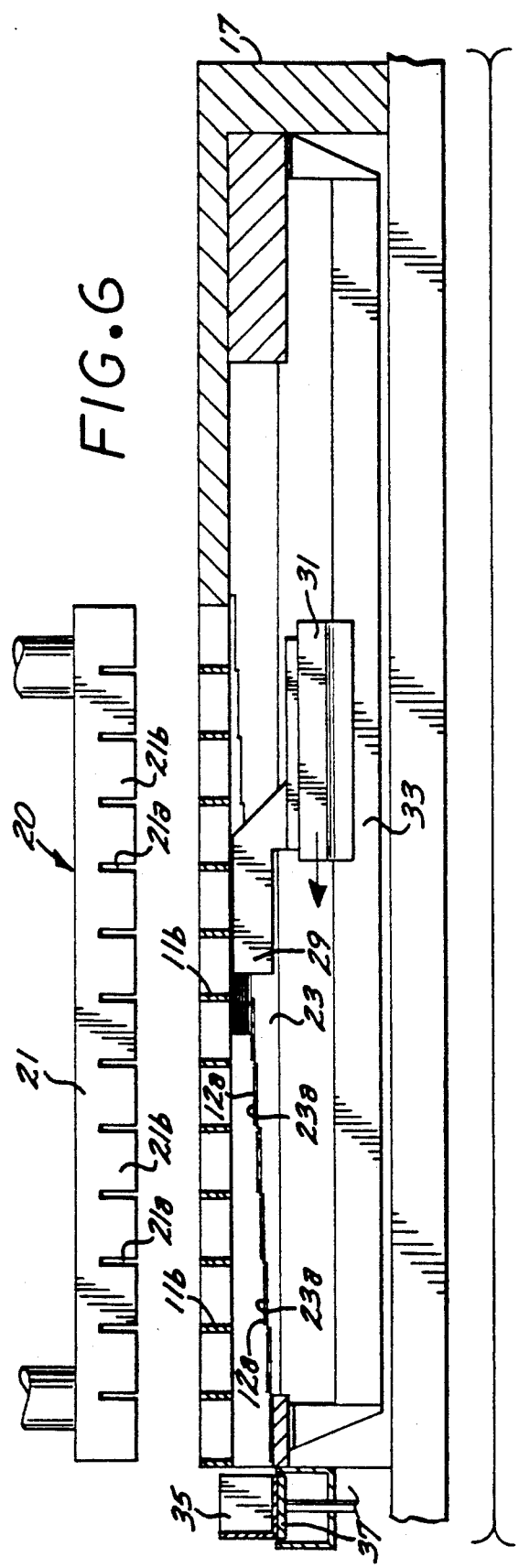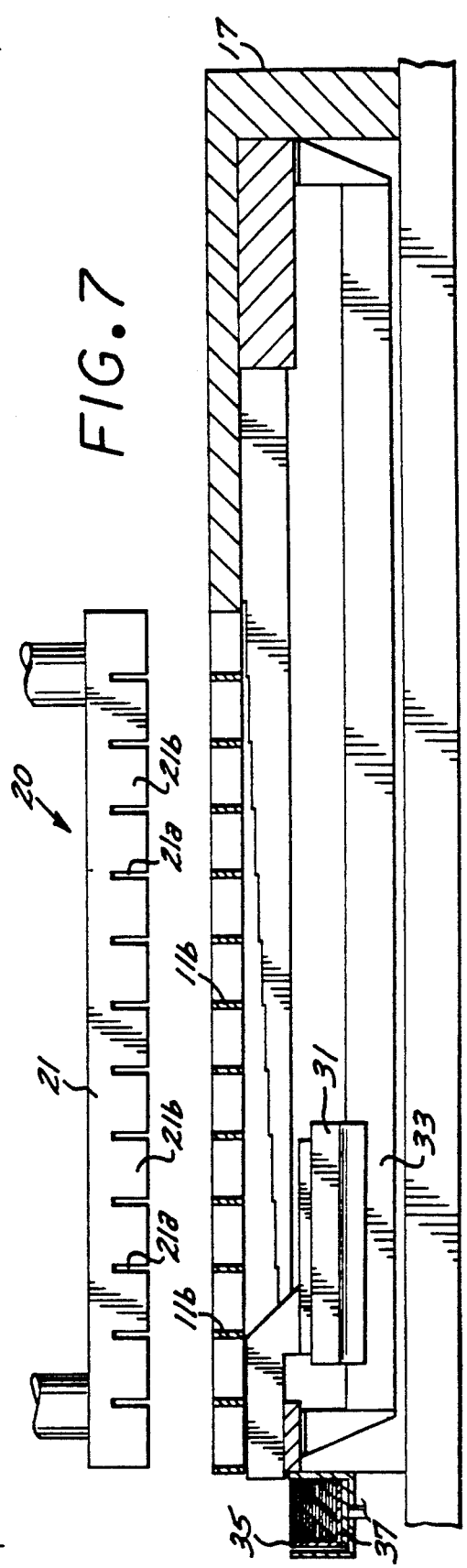

HTCC/LTCC SUBSTRATE BLANKER/MULTI-LAYER COLLATION DIE

BACKGROUND OF THE INVENTION

The subject invention is generally directed to the manufacture of unitized multilayer circuit structures, and is directed more particularly to a blanking and collating structure which blanks a plurality of substrate layers from a substrate tape and stacks the separated layers in preparation for lamination and firing.

Hybrid multilayer circuit structures, also known as hybrid microcircuits, implement the interconnection and packaging of discrete circuit devices, and generally include a unitized multilayer circuit structure formed from a plurality of integrally fused insulating layers (e.g., ceramic layers) having conductor traces disposed therebetween. The discrete circuit devices (e.g., integrated circuits) are commonly mounted on the top insulating layer so as not to be covered by another insulating layer or on an insulating layer having die cutouts formed thereon to provide cavities for the discrete devices. Passive components such as capacitors and resistors can be formed on the same layer that supports the discrete devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive material, whereby the conductive material in contact with predetermined conductive traces between the layers that extend over or under the vias.

Unitized multilayer circuit structures are commonly made pursuant to co-fired technology wherein a unitized multilayer circuit module is made from layers of pyrolyzable dielectric tape (comprising for example a ceramic material) known in the art as "green tape". Generally, each of the green tape layers of a particular module is punched and screen printed to include a predetermined pattern of conductive vias, interconnecting conductive traces, and electrical components such as resistors and capacitors, or portions of capacitors. The individual screen printed green tape layers for a module are then stacked in the required order, and laminated together using a chosen temperature and pressure. The laminated structure is then fired at an elevated temperature. Such co-fired technology has been implemented with low temperature co-fired ceramic (LTCC) as well as with high temperature co-fired ceramic (HTCC).

Examples of low temperature co-fired processing can be found in "Development of a Low Temperature Co-fired Multilayer Ceramic Technology," by William A. Vitriol et al., 1983 ISHM Proceedings, pages 593–598; "Processing and Reliability of Resistors Incorporated Within Low Temperature Co-fired Ceramic Structures," by Ramona G. Pond et al., 1986 ISHM Proceedings, pages 461–472; and "Low Temperature Co-Fireable Ceramics with Co-Fired Resistors," by H. T. Sawhill et al., 1986 ISHM Proceedings, pages 268–271.

In both low temperature and high temperature co-fired technologies, the individual green tape layers for a hybrid module are blanked (i.e., cut) from a larger sheet or strip of unfired green tape, and then collated in the appropriate sequence. Known techniques for blanking and collating have included the use of hand pick and place equipment and robotic equipment. Such equipment is slow and costly, and moreover can process only one hybrid module at a time.

SUMMARY OF THE INVENTION

It would therefore be an advantage to provide a high speed blanking and collating structure for blanking and collating green tape layers for hybrid multilayer structures.

Another advantage would be to provide a high speed blanking and collating structure for simultaneously assembling different hybrid module subassemblies.

The foregoing and other advantages are provided by the invention in apparatus for blanking and collating a plurality of individual pyrolyzable sheets having electrical circuit patterns formed thereon from an integral pyrolyzable sheet having the electrical circuit patterns for the individual sheets printed thereon, where the individual pyrolyzable sheets comprise layers of a hybrid module. The apparatus includes a die having substantially identically sized openings for supporting the integral printed pyrolyzable sheet, a punch assembly engageable with the die for blanking the integral printed pyrolyzable sheet into a plurality of substantially identically sized sheets having electrical circuit patterns formed thereon, and a collation structure located beneath the means for receiving the blanked sheets from the die and for stacking the blanked sheets.

BRIEF DESCRIPTION OF THE DRAWINGS

The advantages and features of the disclosed invention will readily be appreciated by persons skilled in the art from the following detailed description when read in conjunction with the drawing wherein:

FIG. 1 is a schematic top plan view of the die member of the blanking and collating apparatus of the invention.

FIG. 2 is a schematic sectional view of the blanking and collating apparatus of the invention.

FIG. 3 is a schematic perspective view of the collection fingers and carrier thereof which cooperate with a stepped catch plate to collate blanked tape sheets.

FIG. 4 is a schematic elevational view of the blanking and collating apparatus of the invention showing the punch assembly positioned over the die member of blanking and collating apparatus of the invention.

FIG. 5 is a schematic elevational view of the blanking and collating apparatus of the invention showing the punch assembly engaged with the die member of the blanking and collating apparatus, and further showing blanked sheets that have dropped onto the catch plate surfaces located beneath the die plate.

FIG. 6 is an elevational view of the blanking and collating apparatus of the invention depicting the collation of the blanked sheets that have dropped onto the catch plate surfaces located beneath the die plate.

FIG. 7 is an elevational view of the blanking and collating apparatus of the invention depicting the transfer of a stack of collated blanked sheets onto a lamination fixture.

DETAILED DESCRIPTION OF THE DISCLOSURE

Figure 8:
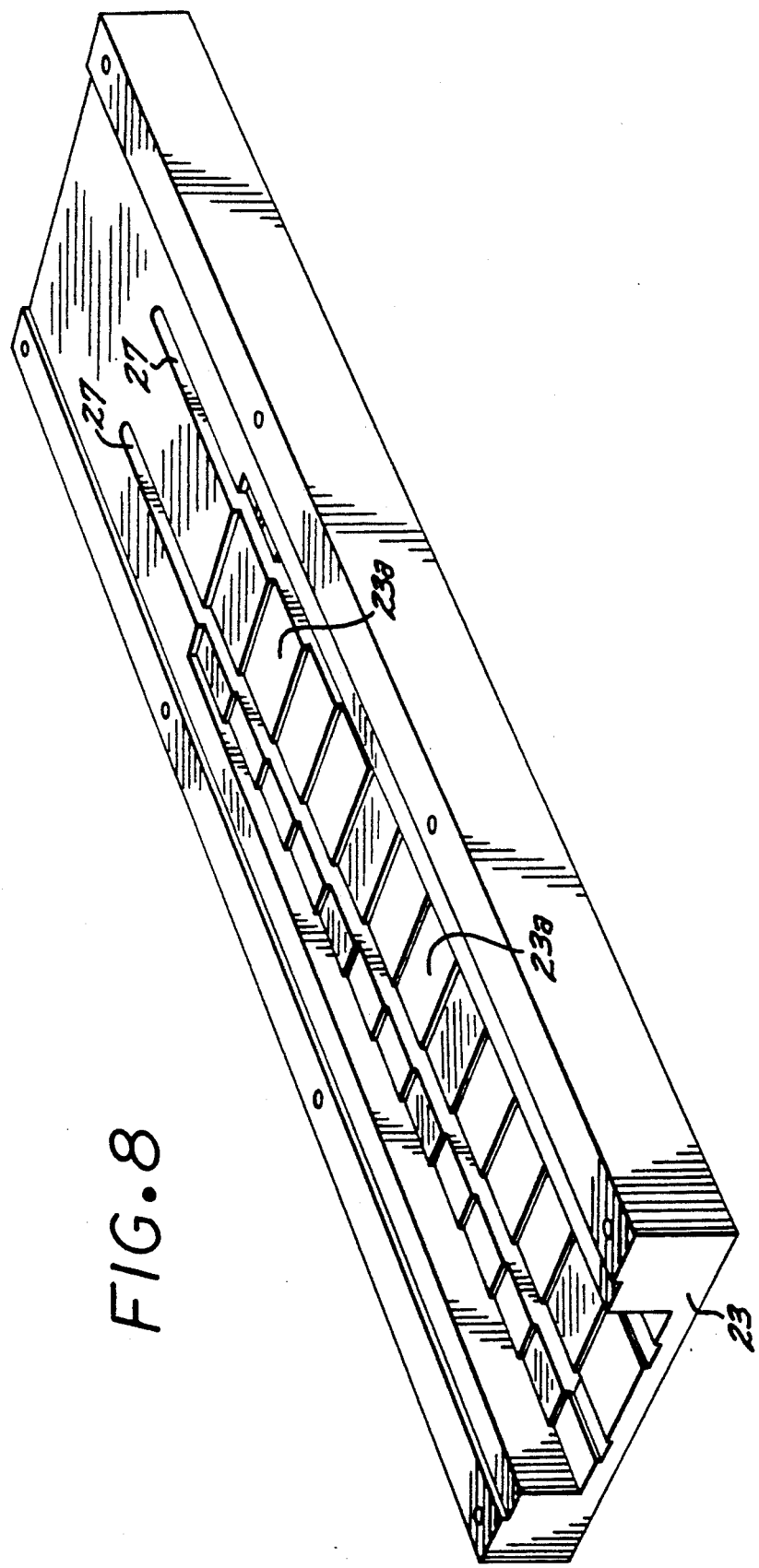
FIG. 8 is a schematic perspective view illustrating the stepped catch plate of the blanking and collating apparatus of the invention.

In the following detailed description and in the several figures of the drawing, like elements are identified with like reference numerals.

The invention is generally directed to apparatus for blanking and collating individual sheets of pyrolyzable, thermally fusible "green tape" having electrical circuits patterns printed thereon from an integral sheet of green tape which has been punched and screen printed to include predetermined patterns of vias, interconnection conductive traces, and electrical components such as resistors and capacitors which form the electrical circuit patterns on the individual sheets. The blanked and collated sheets comprise a subset or complete set of layers for a hybrid module that is formed pursuant to unitizing lamination of the collated sheets thereof. It should be appreciated that the punched and printed layout of the integral sheet is correlated with the blanking and collation provided by the apparatus of the invention.

Referring now to the FIGS. 1, 2 and 4, schematically depicted therein is a blanking and collation apparatus in accordance with the invention which includes a unitary elongated drop through die unit 10 that comprises a horizontal die section 11, vertical parallel side sections 13 that are integral with the longitudinally extending die section 11, laterally extending flanges 15 along the bottom of the side sections 13, and a vertical end section 17 for closing one end of the die unit. The die unit 10 is secured to a base plate 19 by screws or bolts that engage the flanges 15.

The die section 11 includes a plurality of substantially identically sized rectangular die openings 11a arranged side by side along the longitudinal dimension of the die unit from the open end thereof, and are separated from each other by integral narrow cross members 11b. The walls of the openings 11a are vertically oriented and are of substantially the same depth. The dimensions of the die openings 11a are determined by the desired dimensions of the blanked sheets of green tape that are blanked by the blanking and collating apparatus from an integral sheet of green tape that is positioned over the die openings 11a.

The blanking and collating apparatus further includes a vertically movable punch assembly 20 that comprises a rectangular panel 21 having slots 21a formed therein so as to form individual rectangular punches 21b whose outside edges will slidably engage the inside edges of corresponding rectangular openings 11a in the die section 11 when the punch assembly 20 is lowered into engagement therewith. The depth of the slots 21a is equal to or greater than the height of the walls of the die openings 11a so that bottom surfaces of the rectangular punches 21b are flush with or below the bottom of the openings 11a when the rectangular punches 21b are fully engaged in the die openings 11a.

For blanking, the conventional carrier backing is removed from at least a predetermined portion of the integral printed sheet of green tape and, as particularly depicted in FIG. 4, is accurately positioned over the die openings 11a, for example by feed in a direction parallel to the die cross members 11b. The punch assembly 20 is then lowered into engagement with the integral sheet of green tape 12 and the die 11 so that individual sheets are blanked or cut by cooperation of the rectangular punches 21b with the die openings 11a. As shown in FIG. 5, the blanked printed sheets 12a are pushed through the die openings 11a and drop onto an underlying catch plate 23 which is secured to the bottom side of the horizontal die section 11.

Referring particularly to FIG. 8, the catch plate 23 includes a plurality of catch plate surfaces 23a that are located beneath respectively associated openings die openings 11a, and function to receive and support the blanked sheets cut by the cooperation of the die section 11 and the punch assembly 20. Each of the catch plate surfaces 23a is horizontal and parallel to the die section 11, and generally of the same size as each of the die openings 11a. The catch plate surfaces 23a are of different elevations that decrease step wise and generally uniformly toward the open end of the die member 20.

Longitudinal slots 27 formed in the catch plate 23 slidably accommodate collection fingers 29 that extend longitudinally toward the open end of the die unit 10. As shown in FIGS. 3 and 4, the collection fingers 29 are secured to a carrier 31 that is beneath the catch plate 23 and driven by a band cylinder 33 that is parallel to the longitudinal extent of the die section 11. The lowermost catch plate surface 23a includes grooves for accepting the collection fingers 29 which extend in elevation from slightly below the elevation of the lowermost catch plate, so as to insure that a blanked sheet resting on the lowermost catch plate surface will be collected by the collection fingers 29. By way of illustrative example, the band cylinder 33 is a commercially available Tol-O-Matic Model BC100-050 band cylinder.

Referring now to FIGS. 6 and 7, the collection fingers 29 function to stack blanked sheets 12a supported by the catch plate surfaces 23a by sequentially pushing the blanked sheets 12a onto adjacent blanked sheets in order of decreasing elevation. The stack of sheets is then pushed onto a laminating fixture 35 which is supported by a vertically movable platform 37. The assembled stack comprises a complete set of the layers of a hybrid module, or a subset of the layers of a hybrid module. After the laminating fixture 35 is appropriately filled as to the layers provided by the particular blanking and collating apparatus, it is indexed away and another laminating fixture is positioned on the receiving platform 37. The filled laminating fixture 35 can be moved to another blanking and collating apparatus for addition of further layers, or it can be moved to a laminating press for partial fusing of the layers.

The longitudinal extent of the collection fingers 29 and the longitudinal extent of the slots 27 are selected such that displacement of the collection fingers 29 toward the open end of the die member 11 will allow the collection fingers 29 to fully push the gathered stack of blanked green tape sheets past the open edge of the lowermost catch plate surface 23a.

The collection fingers 29 extend vertically from (a) slightly below the elevation of the lowermost catch plate surface 23a that is adjacent the open end of the die unit 10 to (b) slightly below the bottom surface of the die section 11. The spacing between the bottom surface of the die section 11 and the uppermost catch plate surface 23a is selected to allow secure engagement by the collection fingers 29 of a blanked sheet supported on the uppermost catch plate 23a.

The foregoing has been a disclosure of apparatus that advantageously blanks and collates at high speed the individual printed sheets of pyrolyzable, fusible green tape of hybrid multilayer structures from a continuous sheet of green tape which has been printed with predetermined patterns of components that will become electrical circuit patterns pursuant to unitizing lamination of the collated stacks. The apparatus allows for the blanking and collation of the individual sheets for electrically different modules from an integral continuous sheet of green tape, whereby one collated stack of printed sheets would be for one type of module while another stack would be for a different type of module.

Although the foregoing has been a description and illustration of specific embodiments of the invention, various modifications and changes thereto can be made by persons skilled in the art without departing from the scope and spirit of the invention as defined by the following claims.

What is claimed is:

1. Apparatus for blanking and collating individual pyrolyzable sheets having electrical circuit patterns formed thereon from an integral printed pyrolyzable sheet, the apparatus comprising:

die means having a plurality of substantially identically sized die openings for supporting the integral printed pyrolyzable sheet;

punch means having a plurality of die punches engageable with said die openings for blanking the integral printed pyrolyzable sheet into a plurality of substantially identically sized sheets having electrical circuit patterns formed thereon, wherein said plurality of sheets are formed simultaneously;

a catch plate located beneath said die means having a plurality of support surfaces at different elevations for respectively supporting individual ones of said received blanked sheets, wherein the elevation of said support surfaces decreases with distance along a longitudinal direction;

first and second parallel slots formed in said catch plate and oriented parallel to said longitudinal direction;

first and second collection fingers movable in said slots for assembling a stack of blanked sheets starting with the blanked sheet of highest elevation and sequentially adding the blanked sheets to the bottom of the stack in decreasing order of elevation; and means for assembling said received blanked sheets into a stack wherein the position of a blanked sheet is determined by its elevational position on said catch means.

* * * * *